(12) United States Patent
Kato et al.

(10) Patent No.: US 8,668,151 B2
(45) Date of Patent: Mar. 11, 2014

(54) WIRELESS IC DEVICE

(75) Inventors: Noboru Kato, Moriyama (JP); Satoshi Ishino, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/859,880

(22) Filed: Aug. 20, 2010

(65) Prior Publication Data

US 2010/0314455 A1 Dec. 16, 2010

Related U.S. Application Data

(63) Continuation of application No. PCT/JP2009/055758, filed on Mar. 24, 2009.

(30) Foreign Application Priority Data

Mar. 26, 2008 (JP) ................................. 2008-081310

(51) Int. Cl.
*G06K 19/06* (2006.01)

(52) U.S. Cl.
USPC .......................... 235/492; 235/380; 235/451

(58) Field of Classification Search
USPC ................. 343/787; 235/492, 380, 451, 441; 340/572.1
See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |

(Continued)

FOREIGN PATENT DOCUMENTS

| | | |
|---|---|---|
| DE | 10 2006 057 369 A1 | 6/2008 |
| EP | 0 694 874 A2 | 1/1996 |

(Continued)

OTHER PUBLICATIONS

Official Communication issued in International Patent Application No. PCT/JP2008/063025, mailed on Aug. 12, 2008.

(Continued)

*Primary Examiner* — Sonji Johnson
(74) *Attorney, Agent, or Firm* — Keating & Bennett, LLP (57) ABSTRACT

A wireless IC device improves radiation characteristics or directivity of signals and reliably communicates with a reader/writer. The wireless IC device includes an electromagnetically coupled module includes a wireless IC device and a feed circuit substrate, a protective layer, a first radiation plate, and a second radiation plate. The feed circuit substrate includes a feed circuit including inductance elements. The feed circuit is electrically connected to the wireless IC chip and coupled to the radiation plates. Signals received by the radiation plates are provided to the wireless IC chip via the feed circuit. Signals from the wireless IC chip are provided to the radiation plates via the feed circuit and then radiated to the outside.

8 Claims, 7 Drawing Sheets

(56) References Cited

U.S. PATENT DOCUMENTS

| | | |
|---|---|---|
| 5,955,723 A | 9/1999 | Reiner |
| 5,995,006 A | 11/1999 | Walsh |
| 6,104,611 A | 8/2000 | Glover et al. |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 7,777,677 B2 * | 8/2010 | Bungo et al. ........... 343/700 MS |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0044192 A1 | 3/2006 | Egbert |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2008/0024156 A1 | 1/2008 | Arai et al. |
| 2008/0087990 A1 | 4/2008 | Kato et al. |
| 2008/0122717 A1 * | 5/2008 | Su et al. ........................ 343/787 |
| 2008/0169905 A1 | 7/2008 | Slatter |
| 2008/0272885 A1 | 11/2008 | Atherton |
| 2009/0002130 A1 | 1/2009 | Kato |
| 2009/0009007 A1 | 1/2009 | Kato et al. |
| 2009/0065594 A1 | 3/2009 | Kato et al. |
| 2009/0109102 A1 | 4/2009 | Dokai et al. |
| 2009/0262041 A1 | 10/2009 | Ikemoto et al. |

FOREIGN PATENT DOCUMENTS

| | | | |
|---|---|---|---|
| EP | 0 977 145 A2 | 2/2000 | |
| EP | 1 010 543 A1 | 6/2000 | |
| EP | 1 160 915 A2 | 12/2001 | |
| EP | 1 170 795 A2 | 1/2002 | |
| EP | 1 227 540 A1 | 7/2002 | |
| EP | 1 280 232 A1 | 1/2003 | |
| EP | 1 343 223 A1 | 9/2003 | |
| EP | 1 357 511 A2 | 10/2003 | |
| EP | 1 548 872 A1 | 6/2005 | |
| EP | 1 703 589 A1 | 9/2006 | |
| EP | 1 841 005 A1 | 10/2007 | |
| EP | 2 009 738 A1 | 12/2008 | |
| EP | 2023275 A1 * | 2/2009 | ............... H01Q 1/22 |
| EP | 2 148 449 A1 | 1/2010 | |
| JP | 50-143451 A | 11/1975 | |
| JP | 62-127140 U | 8/1987 | |
| JP | 02-164105 A | 6/1990 | |
| JP | 03-262313 A | 11/1991 | |
| JP | 04-150011 A | 5/1992 | |
| JP | 04-167500 A | 6/1992 | |
| JP | 05-327331 A | 12/1993 | |
| JP | 6-53733 A | 2/1994 | |
| JP | 06-077729 A | 3/1994 | |
| JP | 06-177635 A | 6/1994 | |
| JP | 6-260949 A | 9/1994 | |
| JP | 07-183836 A | 7/1995 | |
| JP | 08-056113 A | 2/1996 | |
| JP | 8-87580 A | 4/1996 | |
| JP | 08-088586 A | 4/1996 | |
| JP | 11-149537 A | 6/1996 | |
| JP | 08-176421 A | 7/1996 | |
| JP | 08-180160 A | 7/1996 | |
| JP | 08-279027 A | 10/1996 | |
| JP | 08-307126 A | 11/1996 | |
| JP | 08-330372 A | 12/1996 | |
| JP | 09-014150 A | 1/1997 | |
| JP | 09-035025 A | 2/1997 | |
| JP | 9-93029 A | 4/1997 | |
| JP | 09-245381 A | 9/1997 | |
| JP | 09-252217 A | 9/1997 | |
| JP | 09-270623 A | 10/1997 | |
| JP | 9-512367 A | 12/1997 | |
| JP | 10-069533 A | 3/1998 | |
| JP | 10-505466 A | 5/1998 | |
| JP | 10-171954 A | 6/1998 | |
| JP | 10-193849 A | 7/1998 | |
| JP | 10-293828 A | 11/1998 | |
| JP | 11-039441 A | 2/1999 | |
| JP | 11-075329 A | 3/1999 | |
| JP | 11-085937 A | 3/1999 | |
| JP | 11-102424 A | 4/1999 | |
| JP | 11-103209 A | 4/1999 | |

(56) References Cited

FOREIGN PATENT DOCUMENTS

| | | |
|---|---|---|
| JP | 11-149536 A | 6/1999 |
| JP | 11-149538 A | 6/1999 |
| JP | 11-219420 A | 8/1999 |
| JP | 11-220319 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-243797 A | 9/2000 |
| JP | 2000-251049 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 3075400 U | 11/2000 |
| JP | 2000-349680 A | 12/2000 |
| JP | 2001-028036 A | 1/2001 |
| JP | 2007-18067 A | 1/2001 |
| JP | 2001-043340 A | 2/2001 |
| JP | 2001-66990 A | 3/2001 |
| JP | 2001-505682 A | 4/2001 |
| JP | 2001-168628 A | 6/2001 |
| JP | 2001-188890 A | 7/2001 |
| JP | 2001-240046 A | 9/2001 |
| JP | 2001-256457 A | 9/2001 |
| JP | 2001-257292 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351084 A | 12/2001 |
| JP | 2001-352176 A | 12/2001 |
| JP | 2002-024776 A | 1/2002 |
| JP | 2002-026513 A | 1/2002 |
| JP | 2002-042076 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-522849 A | 7/2002 |
| JP | 2002-230128 A | 8/2002 |
| JP | 2002-232221 A | 8/2002 |
| JP | 2002-252117 A | 9/2002 |
| JP | 2002-259934 A | 9/2002 |
| JP | 2002-280821 A | 9/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-362613 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-026177 A | 1/2003 |
| JP | 2003-030612 A | 1/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-168760 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-309418 A | 10/2003 |
| JP | 2003-317060 A | 11/2003 |
| JP | 2003-331246 A | 11/2003 |
| JP | 2003-332820 A | 11/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-096566 A | 3/2004 |
| JP | 2004-127230 A | 4/2004 |
| JP | 2004-519916 A | 7/2004 |
| JP | 2004-253858 A | 9/2004 |
| JP | 2004-527864 A | 9/2004 |
| JP | 2004-280390 A | 10/2004 |
| JP | 2004-287767 A | 10/2004 |
| JP | 2004-297249 A | 10/2004 |
| JP | 2004-297681 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-124061 A | 5/2005 |
| JP | 2005-129019 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |

(56) References Cited

FOREIGN PATENT DOCUMENTS

| | | |
|---|---|---|
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-275870 A | 10/2005 |
| JP | 2005-284352 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-335755 A | 12/2005 |
| JP | 2005-346820 A | 12/2005 |
| JP | 2005-352858 A | 12/2005 |
| JP | 2006-025390 A | 1/2006 |
| JP | 2006-031766 A | 2/2006 |
| JP | 2006-39902 A | 2/2006 |
| JP | 2006-42059 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-270212 A | 10/2006 |
| JP | 2006-270766 A | 10/2006 |
| JP | 2006-285911 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2007-007888 A | 1/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-122542 A | 5/2007 |
| JP | 2007-150868 A | 6/2007 |
| JP | 2007-159083 A | 6/2007 |
| JP | 2007-159129 A | 6/2007 |
| JP | 2007-266999 A | 10/2007 |
| JP | 4069958 B2 | 4/2008 |
| JP | 2008-160874 A | 7/2008 |
| JP | 11-175678 A | 1/2009 |
| JP | 2009-27291 A | 2/2009 |
| NL | 9100176 A | 3/1992 |
| NL | 9100347 A | 3/1992 |
| WO | 99/67754 A1 | 12/1999 |
| WO | 00/10122 A2 | 2/2000 |
| WO | 02/061675 A1 | 8/2002 |
| WO | 02/097723 A1 | 12/2002 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/115849 A1 | 12/2005 |
| WO | 2006/045682 A | 5/2006 |
| WO | 2007/083574 A1 | 7/2007 |
| WO | 2007/083575 A1 | 7/2007 |
| WO | 2007/119310 A1 | 10/2007 |
| WO | 2007/125683 A1 | 11/2007 |
| WO | 2007/138857 A1 | 12/2007 |
| WO | WO 2007138857 A1 * | 12/2007 |
| WO | 2008/007606 A | 1/2008 |
| WO | WO 2008007606 A1 * | 1/2008 |
| WO | 2008/140037 A1 | 11/2008 |
| WO | 2009/011376 A1 | 1/2009 |

OTHER PUBLICATIONS

Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.

(56) References Cited

OTHER PUBLICATIONS

Official communication issued in counterpart International Application No. PCT/JP2008/056026, mailed Jul. 1, 2008.
Ikemoto et al.: "Wireless IC Device and Electronic Apparatus,"; U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Devicei"; U.S. Appl. No. 12/429,346, filed Apr. 24, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module,"; U.S. Appl. No. 12/536,663, filed Aug. 6, 2009.
Osamura et al.: "Packaging Material With Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.

* cited by examiner

WIRELESS IC DEVICE

BACKGROUND OF THE INVENTION

1. Field of the Invention

The present invention relates to a wireless IC device and, in particular, to a wireless IC device used in an RFID (radio frequency identification) system.

2. Description of the Related Art

As article management systems, there have been developed RFID systems in which a reader/writer, which generates an induction electromagnetic field, and an wireless tag (also called a wireless IC device), which is attached to an article and stores predetermined information, communicate with each other using a non-contact method so as to transmit information. As a wireless tag used in this type of RFID system, Japanese Unexamined Patent Application Publication No. 2001-257292 describes a semiconductor apparatus that has an antenna coil formed on one main surface of an IC chip and is used in a contactless IC card. This semiconductor apparatus wirelessly communicates with a reader/writer using the antenna coil electrically connected to a circuit inside the IC chip.

However, as for the semiconductor apparatus described in Japanese Unexamined Patent Application Publication No. 2001-257292, the size of the antenna coil is small, since the size is the same as that of the IC chip at most. Therefore, the semiconductor apparatus has a problem in that it cannot communicate with a reader/writer if there is a long distance between the semiconductor apparatus and the reader/writer or if the position of the semiconductor apparatus relative to the reader/writer is shifted even a bit. Also, if a signal having a predetermined frequency is transmitted from the antenna coil, it is necessary to set the length of the antenna coil to ½ of a wavelength corresponding to the frequency of the signal. However, the IC chip is small. Therefore, if an attempt is made to dispose an antenna coil having a predetermined length on the IC chip, the widths of electrodes of the coil or the interval between the electrodes must be narrowed. For this reason, a facility for manufacturing antenna coils with high accuracy is required and there remains a possibility that even minute variations of the IC chips cause variations in communication frequency and thus a communication failure occurs.

SUMMARY OF THE INVENTION

Accordingly, preferred embodiments of the present invention provide a wireless IC device that improves the radiation characteristics or directivity of signals and can reliably communicate with a reader/writer.

A wireless IC device according to a preferred embodiment of the present invention includes a wireless IC device; a feed circuit substrate coupled to the wireless IC device, wherein the feed circuit substrate includes a feed circuit including a resonant circuit and/or a matching circuit, and the resonant circuit and/or the matching circuit includes at least one inductance element; and first and second radiation plates arranged to radiate a transmission signal provided from the feed circuit and/or provide a received signal to the feed circuit. The wireless IC device preferably includes a protective layer or a metal case, the protective layer or the metal case covering the wireless IC device, provided on one main surface of the feed circuit substrate, that the first radiation plate is an electrode disposed on the protective layer or the metal case, and that the second radiation plate is disposed on the other main surface of the feed circuit substrate.

In the wireless IC device, the first and second radiation plates function as antennas, signals received by the first and second radiation plates are provided to the wireless IC via the feed circuit so that the wireless IC operates, and signals from the wireless IC are provided to the first and second radiation plates via the feed circuit and then radiated to the outside.

According to a preferred embodiment of the present invention, the radiation characteristics or directivity can be improved using the first radiation plate disposed on one main surface of the feed circuit substrate and the second radiation plate disposed on the other main surface thereof. Thus, the wireless IC device can reliably communicate with a reader/writer. In particular, the second radiation plate may be larger in size than that of the feed circuit substrate, and the size or shape of the second radiation plate can be selected arbitrarily.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of a wireless IC device according to the present invention will be described with reference to the accompanying drawings.

First Preferred Embodiment

FIGS. 1 to 4

Figure 1:
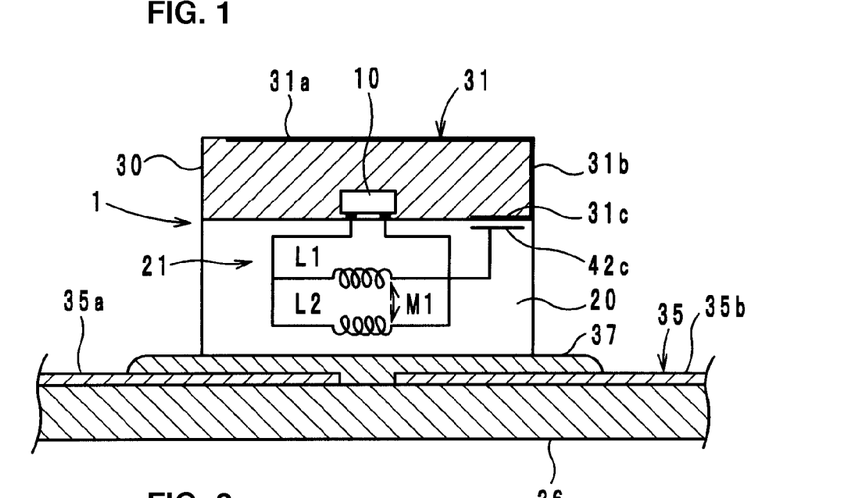
FIG. 1 is a schematic sectional view showing a wireless IC device according to a first preferred embodiment of the present invention.

As shown in FIG. 1, a wireless IC device according to a first preferred embodiment, includes a wireless IC chip 10 that processes transmission/reception signals having a predetermined frequency, a feed circuit substrate 20 including a feed circuit 21 electrically connected to the wireless IC chip 10, a protective layer 30, a first radiation plate 31, and a second radiation plate 35. The combined wireless IC chip 10 and feed circuit substrate 20 will be referred to as an "electromagnetically coupled module 1."

Figure 4:
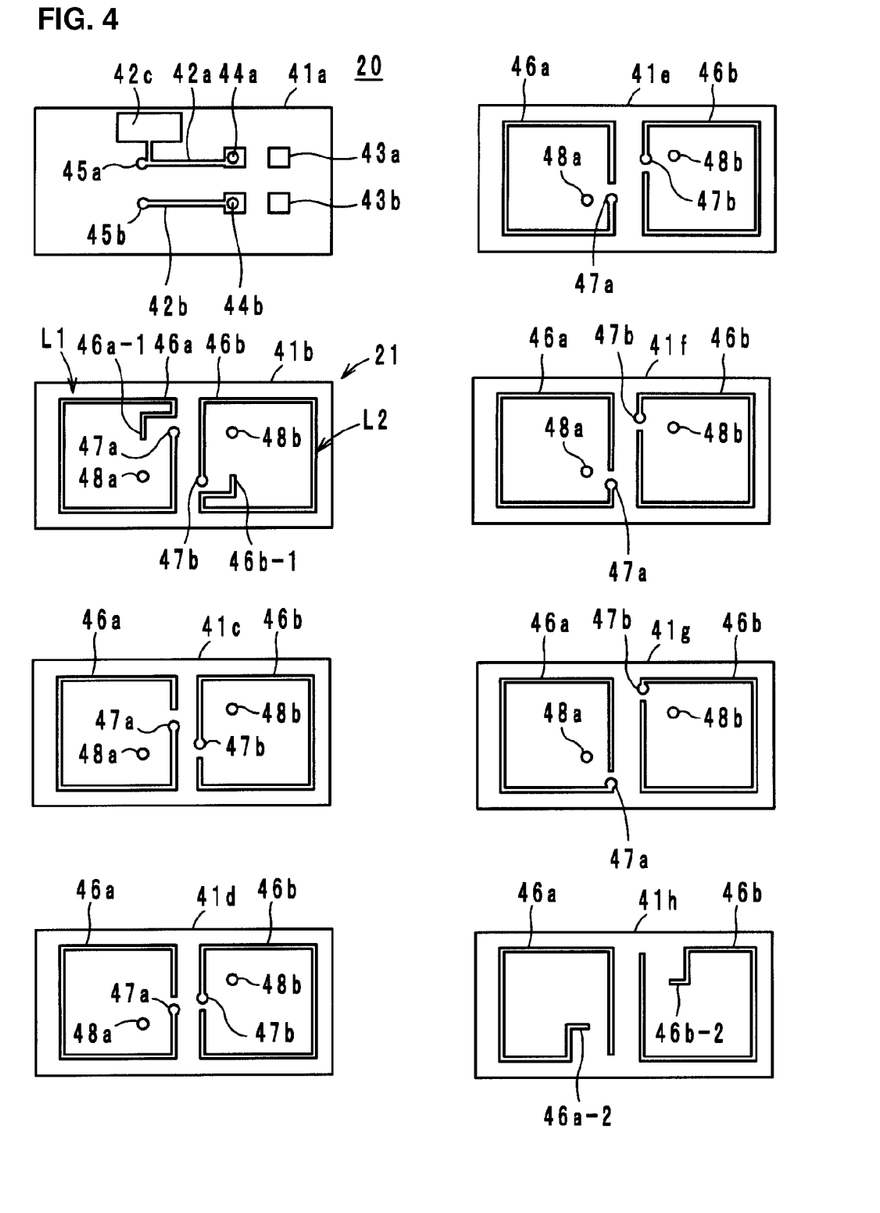
FIG. 4 is a plan view showing a lamination structure of the feed circuit substrate of the wireless IC device according to the first preferred embodiment of the present invention.

As shown as an equivalent circuit in FIG. 1, the feed circuit 21 is preferably arranged to define a resonance circuit and/or a matching circuit including inductance elements L1 and L2 that have different inductance values and are magnetically coupled (indicated by a mutual inductance M1) to each other in opposite phase (details will be described below with reference to FIG. 4).

Figure 3:
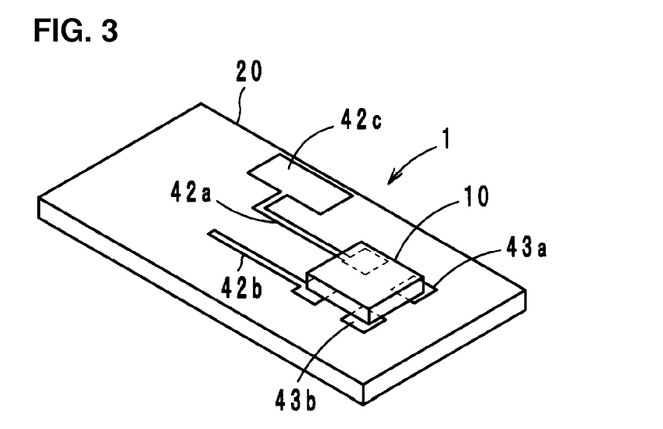
FIG. 3 is a perspective view showing a state where a wireless IC chip is mounted on a feed circuit substrate included in the wireless IC device according to the first preferred embodiment of the present invention.

The wireless IC chip 10 includes a clock circuit, a logic circuit, a memory circuit, and the like. Necessary information is stored in the wireless IC chip 10. A pair of input/output terminal electrodes (not shown) and a pair of mounting terminal electrodes (not shown) are provided on the back surface of the wireless IC chip 10. As shown in FIG. 3, the input/output terminal electrodes and mounting terminal electrodes are electrically connected to feed terminal electrodes 42a and 42b and mounting electrodes 43a and 43b, respectively, disposed on the feed circuit substrate 20 via metal bumps or the like.

The wireless IC chip 10 is mounted on the main surface (top surface) of the feed circuit substrate 20 and is covered with the protective layer 30 made of a resin material (e.g., epoxy resin).

Figure 2:
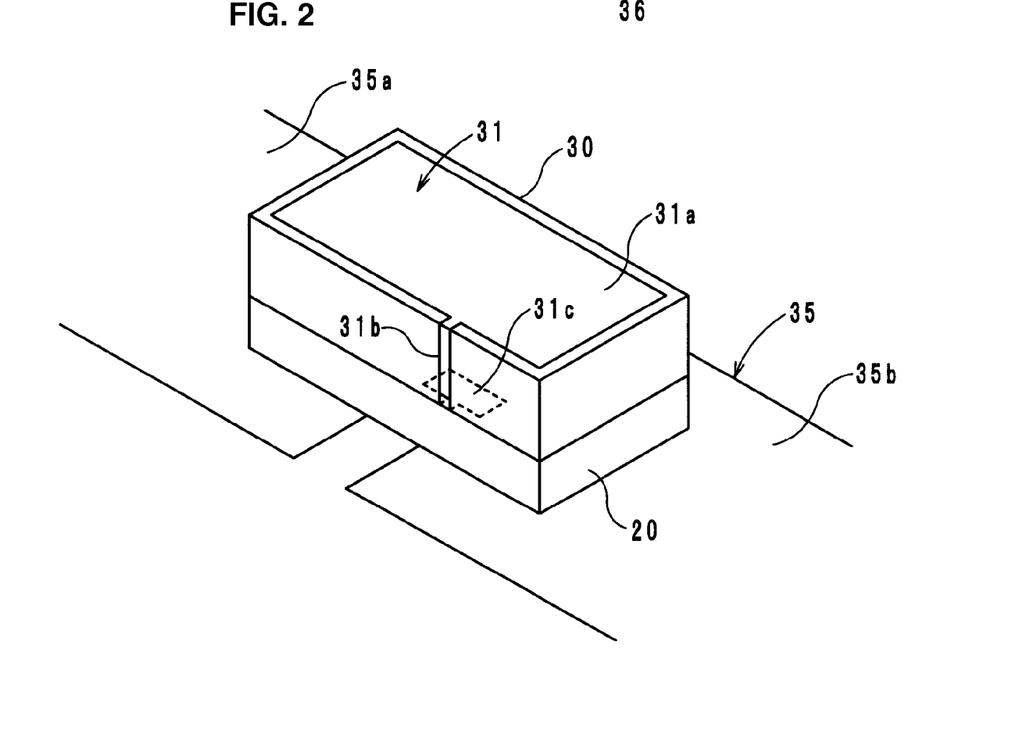
FIG. 2 is a perspective view showing the wireless IC device according to the first preferred embodiment of the present invention.

As shown in FIG. 2, the first radiation plate 31 is disposed on a surface of the protective layer 30 as an electrode made of a non-magnetic metal material. The first radiation plate includes an electrode portion 31a disposed on the approximately entire top surface of the protective layer 30, an electrode portion 31b disposed on one side surface thereof, and an electrode portion 31c disposed on the back surface thereof. The electrode portion 31c is opposed to an electrode portion 42c of the feed circuit 21. The feed circuit 21 and first radiation plate 31 are capacitively coupled to each other.

The second radiation plate 35 is disposed on a surface of a print substrate 36 as a loop-shaped electrode made of a non-magnetic material. The feed circuit substrate 20 is affixed to an end 35a, which is one end of the second radiation plate 35, and an end 35b, which is the other end thereof, via an adhesive 37. The ends 35a and 35b are each electromagnetically coupled to one of the inductance elements L1 and L2. The print substrate 36 is a print substrate embedded in an article such as a cell phone, for example.

The inductance elements L1 and L2 included in the feed circuit 21 are magnetically coupled to each other in opposite phase and thus resonate at a frequency that the wireless IC chip processes. Also, the inductance elements L1 and L2 are electromagnetically coupled to the ends 35a and 35b. At the same time, the feed circuit 21 is capacitively coupled to the first radiation plate 31 at the electrode portion 42c. Also, the feed circuit 21 is electrically connected to the input/output terminal electrodes (not shown) of the wireless IC chip 10. Thus, the feed circuit 21 matches the impedance (typically 50Ω) of the wireless IC chip 10 with the impedances (spatial impedance 377Ω) of the radiation plates 31 and 35.

The feed circuit 21 transmits transmission signals having a predetermined frequency transmitted from the wireless IC chip 10, to the radiation plates 31 and 35, and selects reception signals having a predetermined frequency from among signals received by the radiation plates 31 and 35 and provides the selected signals to the wireless IC chip 10. Thus, in this wireless IC device, the wireless IC chip 10 operates on the basis of signals received by the radiation plates 31 and 35, and response signals from the wireless IC chip 10 are radiated from the radiation plates 31 and 35 to the outside.

As seen above, this wireless IC device can improve radiation characteristics or directivity using the first radiation plate 31 and second radiation plate 35 and thus can reliably communicate with a reader/writer. In particular, the second radiation plate 35 can be formed in a size larger than that of the electromagnetically coupled module 1 and in any form.

Also, the resonant frequency of signals are set in the feed circuit 21 provided on the feed circuit substrate 20. Therefore, even if this wireless IC device is mounted on various articles, the wireless IC device operates as it is, variations in radiation characteristics are prevented, and the need to change the designs of the radiation plates 31 and 35 or the like for each individual article is eliminated. Also, the frequency of transmission signals radiated from the radiation plates 31 and 35 and the frequency of reception signals provided to the wireless IC chip 10 are substantially equivalent to the resonant frequency of the feed circuit 21 of the feed circuit substrate 20. Also, the maximum gains of signals are substantially determined by at least one of the size or shape of the feed circuit 21, the distances between the feed circuit 21 and radiation plates 31 and 35, and a medium. Since the frequency of transmission/reception signals is determined in the feed circuit substrate 20, stable frequency characteristics can be obtained without depending on the shape or size of the radiation plates 31 and 35, the disposition relation between these radiation plates, and the like, for example, even if the wireless IC device is rounded off or interposed between dielectric materials.

Hereafter, the configuration of the feed circuit substrate 20 will be described with reference to FIG. 4. The feed circuit substrate 20 is preferably formed by laminating, crimping, and firing ceramic sheets 41a to 41h made of a dielectric material or a magnetic material. Feed terminal electrodes 42a and 42b, mounting electrodes 43a and 43b, the electrode portion 42c to be capacitively coupled with the first radiation plate 31, and via-hole conductors 44a, 44b, 45a, and 45b are formed on the sheet 41a, which is the uppermost layer. Wiring electrodes 46a and 46b defining the inductance elements L1 and L2 and, if necessary, via-hole conductor 47a, 47b, 48a, and 48b are formed on each of the sheets 41b to 41h, which are the second to eighth layers.

By laminating the above-mentioned sheets 41a to 41h, the inductance element L1 where the wiring electrodes 46a are connected to one another in a spiral manner via the via-hole conductor 47a is formed and the inductance element L2 where the wiring electrodes 46b are connected to one another in a spiral manner via the via-hole conductor 47b is formed. Also, capacitances are formed between the lines of the wiring electrodes 46a and the wiring lines 46b.

An end 46a-1 of the wiring electrode 46a on the sheet 41b is connected to the feed terminal electrode 42a via the via-hole conductor 45a. An end 46a-2 of the wiring electrode 46a on the sheet 41h is connected to the feed terminal electrode 42b via the via-hole conductors 48a and 45b. An end 46b-1 of the wiring electrode 46b on the sheet 41b is connected to the feed terminal electrode 42b via the via-hole conductor 44b. An end 46b-2 of the wiring electrode 46b on the sheet 41h is connected to the feed terminal electrode 42a via the via-hole conductors 48b and 44a.

In the above-mentioned feed circuit 21, the inductance elements L1 and L2 are wound in opposite directions, so magnetic fields caused by the inductance elements L1 and L2 are cancelled out by each other. Since the magnetic fields are cancelled out, the lengths of the wiring electrodes 46a and those of the wiring electrodes 46b must be increased to some extent in order to obtain a predetermined inductance value. Thus, the Q value is reduced. Therefore, the steepness of the resonance characteristics is lost and thus the frequency band is widened around the resonant frequency.

When the feed circuit substrate 20 is seen through from above, the inductance elements L1 and L2 are located in left and right different positions. Also, magnetic fields caused by the inductance elements L1 and L2 are directed in opposite directions. Thus, when coupling the feed circuit 21 to the ends 35a and 35b of the loop-shaped radiation plate 35, currents directed in opposite directions are excited on the ends 35a and 35b, and signals can be transmitted or received by the loop-shaped radiation plate 35. The inductance elements L1 and L2 may be coupled to two different radiation plates (dipole antenna).

By forming the feed circuit substrate 20 using a magnetic material and forming the inductance elements L1 and L2 in the magnetic material, a large inductance value can be obtained. It is also possible to correspond to a frequency of about 13.56 MHz, for example. Further, even if processing variations in magnetic material sheet or variations in permeability occur, the difference in impedance between the feed circuit substrate 20 and wireless IC chip 10 can be absorbed. The permeability μ of the magnetic material is preferably 100 or so.

Also, by setting a substantially identical value for the inductance values of the two inductance elements L1 and L2, the magnitudes of magnetic fields caused by the inductance elements L1 and L2 can be equalized. Thus, the amounts with which magnetic fields caused by the inductance elements L1 and L2 cancel out each other can be equalized. Thus, the frequency band can be widened around the resonant frequency.

The feed circuit substrate 20 may be a multilayer substrate made of ceramic or a resin or may be a substrate formed by laminating flexible sheets made of a dialectic material such as polyimide or liquid crystal polymers, for example. In particular, the inductance elements L1 and L2 are embedded in the feed circuit substrate 20; therefore, the feed circuit 21 is not easily affected by the change in dielectric constant of the outside of the substrate. Thus, variations in radiation characteristics can be prevented.

Also, the feed circuit substrate 20 does not need to be affixed onto the ends 35a and 35b of the second radiation plate 35 and may be disposed near the ends 35a and 35b.

Second Preferred Embodiment

Figure 5:
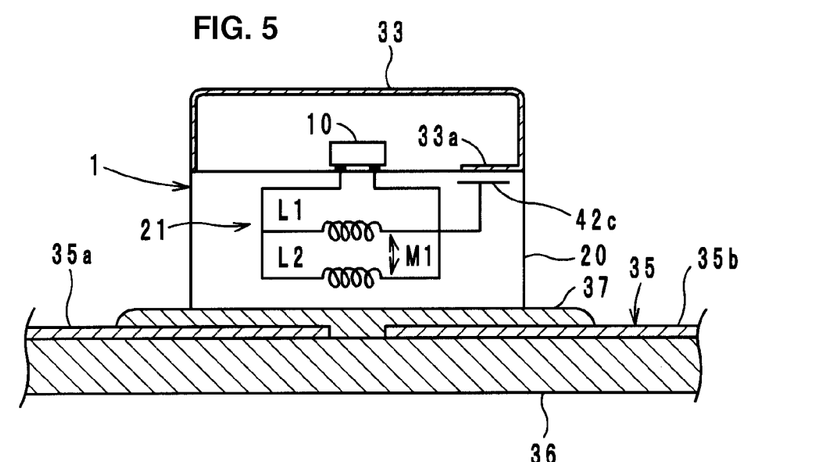
FIG. 5 is a schematic sectional view showing a wireless IC device according to a second preferred embodiment of the present invention.

FIG. 5

As shown in FIG. 5, a wireless IC device according to a second preferred embodiment of the present invention, basically has the same configuration as that of the above-mentioned first preferred embodiment. What is different is that, instead of the above-mentioned protective layer 30, a metal case 33 that covers the wireless IC chip 10 and is made of a non-magnetic material (for example, phosphor bronze) is provided on the feed circuit substrate 20 and the metal case 33 serves as the first radiation plate. The metal case 33 includes a protruding electrode portion 33a, and the electrode portion 33a is opposed to the electrode portion 42c of the feed circuit 21 and capacitively coupled thereto.

The second preferred embodiment has the same effects and advantages as those of the above-mentioned first preferred embodiment except that the metal case 33 serves as the first radiation plate.

Third Preferred Embodiment

Figure 6:
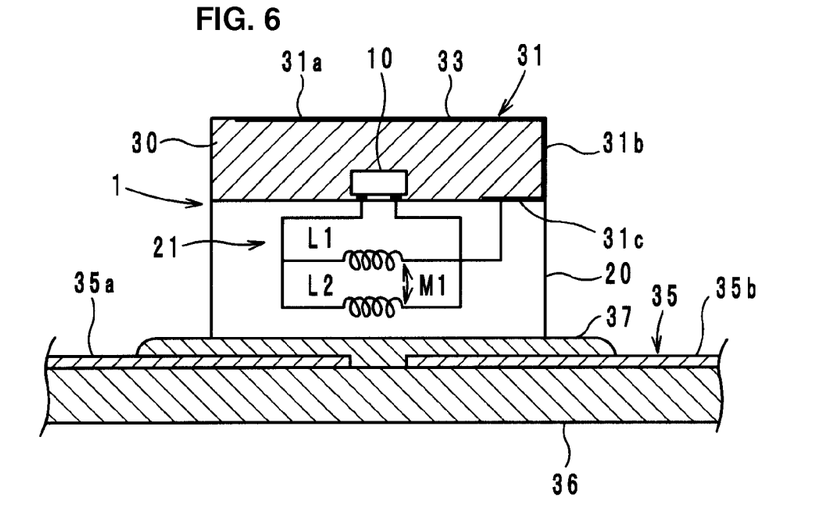
FIG. 6 is a schematic sectional view showing a wireless IC device according to a third preferred embodiment of the present invention.

FIG. 6

As shown in FIG. 6, a wireless IC device according to a third preferred embodiment of the present invention, has the same configuration as that of the above-mentioned first preferred embodiment. What is different is that the feed circuit 21 is directly electrically connected (coupled) to the electrode portion 31c of the first radiation plate 31.

The third preferred embodiment has the same effects and advantages as those of the above-mentioned first preferred embodiment except that the feed circuit 21 and first radiation plate 31 are directly electrically coupled to each other.

Fourth Preferred Embodiment

Figure 7:
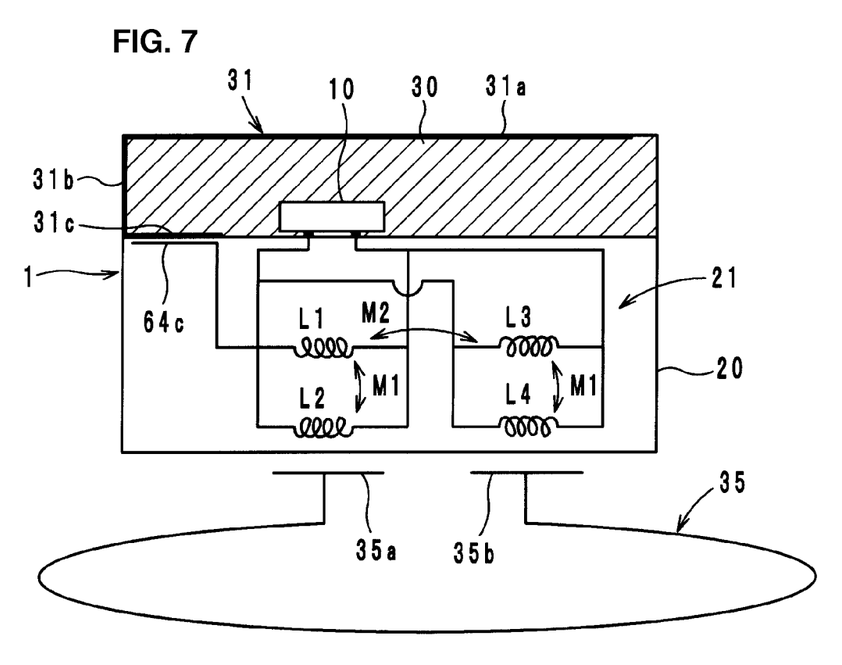
FIG. 7 is a schematic sectional view showing a wireless IC device according to a fourth preferred embodiment of the present invention.
Figure 8:
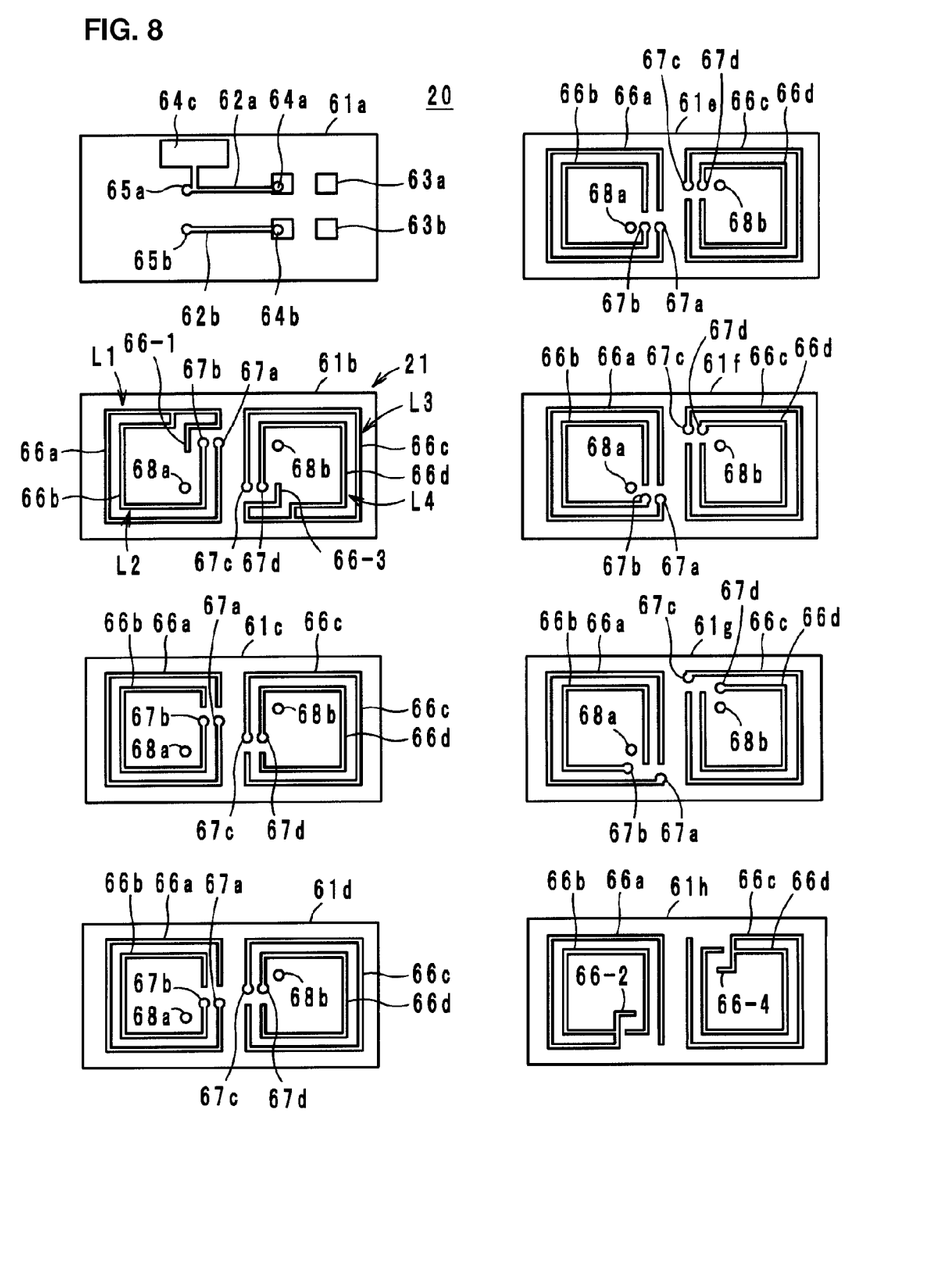
FIG. 8 is a plan view showing a lamination structure of a feed circuit substrate of the wireless IC device according to the fourth preferred embodiment of the present invention.

FIGS. 7 and 8

As shown in FIG. 7, in a wireless IC device according to a fourth preferred embodiment of the present invention, the electromagnetically coupled module 1 includes the wireless IC chip 10 and feed circuit substrate 20 is affixed to the ends 35a and 35b of the loop-shaped second radiation plate 35 formed on a print substrate (not shown) via an adhesive.

Also, the first radiation plate 31 is preferably arranged as an electrode on the protective layer 30 covering the wireless IC chip 10. As with the above-mentioned first preferred embodiment, the first radiation plate 31 includes the electrode portion 31a disposed on the approximately entire top surface of the protective layer 30, electrode portion 31b disposed on one side surface thereof, and electrode portion 31c disposed on the back surface thereof. The electrode portion 31c is opposed to an electrode portion 64c of the feed circuit 21. The feed circuit 21 and first radiation plate 31 are capacitively coupled to each other.

As shown as an equivalent circuit in FIG. 7, in the feed circuit 20, the inductance elements L1 and L2 having different inductance values are magnetically coupled to each other in phase (mutual inductance M1) and the inductance elements L3 and L4 having different inductance values are magnetically coupled to each other in phase (mutual inductance M1). And the inductance elements L1 and L3 are magnetically coupled in opposite phase (indicated by a mutual inductance M2) and the inductance elements L2 and L4 are magnetically coupled in opposite phase. The feed circuit 21 including a resonant circuit and/or a matching circuit including the inductance elements L1, L2, L3, and L4 will be described below with reference to FIG. 8.

The inductance elements L1 and L2 and inductance elements L3 and L4 included in the feed circuit 21 are magnetically coupled to each other in opposite phase and thus resonate at a frequency that the wireless IC chip 10 processes, and are electromagnetically coupled to the ends 35a and 35b of the loop-shaped radiation plate 35. At the same time, the feed circuit 21 is capacitively coupled to the first radiation plate 31 at the electrode portion 64c. Also, the feed circuit 21 is electrically connected to the input/output terminal electrodes (not shown) of the wireless IC chip 10. Thus, the feed circuit 21 matches the impedance (typically, 50Ω) of the wireless IC chip 10 with the impedances (spatial impedance 377Ω) of the radiation plates 31 and 35.

As for the fourth preferred embodiment, when a signal having a positive polarity is provided to the end 35a of the loop-shaped radiation plate 35, a signal having a negative polarity is provided to the end 35b thereof. Thus, a current flows from the positive (end 35*a*) to negative (end 35*b*) direction, and signals are transmitted between the radiation plate 35 and feed circuit 21.

Therefore, as in the above-mentioned first preferred embodiment, the feed circuit 21 transmits transmission signals having a predetermined frequency transmitted from the wireless IC chip 10, to the radiation plates 31 and 35, and selects reception signals having a predetermined frequency from among signals received by the radiation plates 31 and 35 and provides the selected signals to the wireless IC chip 10. Therefore, in this wireless IC device, the wireless IC chip 10 operates on the basis of signals received by the radiation plates 31 and 35, and response signals from the wireless IC chip 10 are radiated from the radiation plates 31 and 35 to the outside. As seen, the fourth preferred embodiment basically has the same effects and advantages as those of the above-mentioned first preferred embodiment.

Hereafter, the configuration of the feed circuit substrate 20 will be described with reference to FIG. 8. The feed circuit substrate 20 is preferably formed by laminating, crimping, and firing ceramic sheets 61*a* to 61*h* made of a dielectric material or a magnetic material. Feed terminal electrodes 62*a* and 62*b*, mounting electrodes 63*a* and 63*b*, the electrode portion 64*c* to be capacitively coupled with the first radiation plate 31, and via-hole conductors 64*a*, 64*b*, 65*a*, and 65*b* are formed on the sheet 61*a*, which is the uppermost layer. Wiring electrodes 66*a*, 66*b*, 66*c*, and 66*d* defining the inductance elements L1, L2, L3, and L4 and, if necessary, via-hole conductor 67*a*, 67*b*, 67*c*, 67*d*, 68*a*, and 68*b* are formed on each of the sheets 61*b* to 61*h*, which are the second to eighth layers.

By laminating the above-mentioned sheets 61*a* to 61*h*, the inductance element L1 where the wiring electrodes 66*a* are connected to one another in a spiral manner via the via-hole conductor 67*a* is formed and the inductance element L2 where the wiring electrodes 66*b* are connected to one another in a spiral manner via the via-hole conductor 67*b* is formed. Also, the inductance element L3 where the wiring electrodes 66*c* are connected to one another in a spiral manner via the via-hole conductor 67*c* is formed and the inductance element L4 where the wiring electrodes 66*d* are connected to one another in a spiral manner via the via-hole conductor 67*d* is formed. Also, capacitances are formed among the lines of the wiring electrodes 66*a*, 66*b*, 66*c*, and 66*d*.

An end 66-1 combining the wiring electrode 66*a* and 66*b* on the sheet 61*b* is connected to the feed terminal electrode 62*a* via the via-hole conductor 65*a*. An end 66-2 combining the wiring electrode 66*a* and 66*b* on the sheet 61*h* is connected to the feed terminal electrode 62*b* via the via-hole conductors 68*a* and 65*b*. An end 66-3 combining the wiring electrode 66*c* and 66*d* on the sheet 61*b* is connected to the feed terminal electrode 62*b* via the via-hole conductor 64*b*. An end 66-4 combining the wiring electrode 66*c* and 66*d* on the sheet 61*h* is connected to the feed terminal electrode 62*a* via the via-hole conductors 68*b* and 64*a*.

The feed circuit 21 having the above-mentioned configuration basically has the same effects as those of the feed circuit 21 described in the first preferred embodiment. In particular, the inductance elements L1 and L2 are preferably defined by the two wiring electrodes 66*a* and 66*b* adjacent to each other on an identical plane, and the inductance elements L3 and L4 are defined by the two wiring electrodes 66*c* and 66*d* adjacent to each other on an identical plane. Therefore, the wideband resonance characteristics can be obtained by changing the lengths of the wiring electrodes or the intervals between the electrodes.

The inductance elements L1 to L4 may be coupled to a radiation plate serving as a dipole antenna rather than the loop-shaped radiation plate.

Fifth Preferred Embodiment

Figure 9:
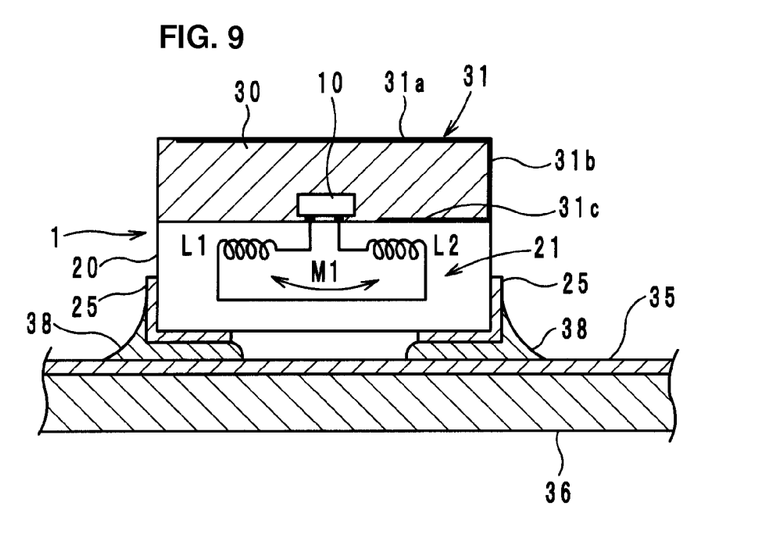
FIG. 9 is a schematic sectional view showing a wireless IC device according to a fifth preferred embodiment of the present invention.

FIG. 9

As shown in FIG. 9, an wireless IC device, which is a fifth preferred embodiment, includes the feed circuit substrate including the feed circuit 21 formed as a resonant circuit and/or a matching circuit including the inductance elements L1 and L2 magnetically coupled to each other (indicated by the mutual inductance M1).

The wireless IC chip 10 is mounted on the feed circuit substrate 20 and electrically connected to ends of the inductance elements L1 and L2. The first radiation plate 31 shown in the above-mentioned first preferred embodiment is disposed on the protective layer 30, and the electrode portion 31*c* thereof is electromagnetically coupled to the feed circuit 21. Also, mounting external electrodes 25 are arranged to extend from the bottom surface of the feed circuit substrate 20 to side surfaces thereof.

The second radiation plate 35 serving as a monopole antenna is disposed on the print substrate 36 and is electrically connected to the mounting external electrodes 25 via solder 38. The second radiation plate 35 is electromagnetically coupled to the feed circuit 21 via the solder 38 and the external electrodes 25.

In the above-mentioned configuration, the operation of the feed circuit 21 is the same as that of the above-mentioned first preferred embodiment, and the effects and advantages thereof are also as described in the first preferred embodiment.

In the above-mentioned wireless IC devices, the protective layer 30 or metal case 33 covering the wireless IC chip 10 is provided on one main surface of the feed circuit substrate 20, the first radiation plate is the electrode 31 disposed on the protective layer 30, or the first radiation plate is the metal case 33, and the second radiation plate 35 is disposed on the other main surface of the feed circuit substrate 20.

The feed circuit 21 is electromagnetically coupled to the second radiation plate 35 and matches the inductance of the wireless IC chip 10 with the inductances of the first radiation plate 31 or 33 and second radiation plate 35. The resonant frequency of signals radiated from the first radiation plate 31 or 33 and second radiation plate 35 is substantially equivalent to the self-resonant frequency of the feed circuit 21. Since the frequency of signals is determined in the feed circuit 21, the lengths or shapes of the first radiation plate 31 or 33 and second radiation plate 35 are arbitrary. Therefore, the degree of flexibility in the designs of the first radiation plate 31 or and second radiation plate 35 is increased. Also, the variations in frequency characteristics are small and stable frequency characteristics can be obtained without depending on the shapes or sizes of the first radiation plate 31 or 33 and second radiation plate 35, the disposition relation therebetween, or the like, for example, even if the wireless IC device is rounded off or interposed between dielectric materials. Also, even if this wireless IC device is mounted on various articles, the wireless IC device operates as it is, variations in radiation characteristics are prevented, and the need to change the designs of the radiation plates or the like for each individual article is eliminated.

In particular, the feed circuit 21 includes at least two inductance elements L1 and L2 that have different inductance values and are coupled to each other. By making the feed circuit 21 hold multiple resonant frequencies using different inductance values, the frequency band of the wireless IC device can be widened. Thus, it is possible to use the wireless IC device in various countries in the world without changing the design.

The first radiation plate 31 may be disposed on a surface of the protective layer 30 or inside the protective layer 30. The second radiation plate 35 may be disposed on a surface of the print substrate 36 or inside the print substrate 36. The second radiation plate 35 may be a long-length or flat electrode such as a dipole antenna. The first radiation plate 31 may be an inverted-F antenna or an inverted-L antenna.

Also, the mounting external electrode 25 may be disposed on the other main surface of the feed circuit substrate 20. The feed circuit substrate 20 may be surface-mounted on the print substrate 36. Also, the feed circuit 21 and second radiation plate 35 may be capacitively coupled to each other.

The wireless IC device according to the present invention is not limited to the above-mentioned preferred embodiments and various changes can be made to the preferred embodiments without departing from the spirit and scope of the invention, as a matter of course.

For example, the wireless IC may be disposed on the feed circuit substrate so that the feed circuit substrate and wireless IC device are integrated. Also, the wireless IC and feed circuit may be connected to each other in such a manner that these elements are electrically connected to each other or may be coupled to each other via an insulating film.

As seen, preferred embodiments of the present invention is useful as a wireless IC device. In particular, preferred embodiments of the present invention are excellent in that the radiation characteristics or directivity of signals can be improved and the wireless IC device can reliably communicate with a reader/writer.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device comprising:
   a wireless IC;
   a feed circuit substrate that is coupled to the wireless IC and includes a feed circuit including a resonant circuit and/or a matching circuit, the resonant circuit and/or the matching circuit including at least one inductance element;
   first and second radiation plates arranged to radiate a transmission signal provided from the feed circuit and/or provide a received signal to the feed circuit; and
   a protective layer or a metal case covering the wireless IC and provided on one main surface of the feed circuit substrate; wherein
   the first radiation plate is an electrode disposed on the protective layer or the metal case, and the second radiation plate is disposed on another main surface of the feed circuit substrate;
   the second radiation plate is larger in size than the feed circuit substrate and the first radiation plate;
   the wireless IC is disposed on the feed circuit substrate;
   the first radiation plate is an inverted-F antenna or an inverted-L antenna; and
   when viewed in a direction perpendicular to the one main surface of the feed circuit board, the first radiation plate overlaps an entirety of the feed circuit and an entirety of the wireless IC.

2. The wireless IC device according to claim 1, wherein the feed circuit is electromagnetically coupled to the second radiation plate and matches an inductance of the wireless IC and inductances of the first and second radiation plates.

3. The wireless IC device according to claim 1, wherein a resonant frequency of signals radiated from the first and second radiation plates is substantially equivalent to a self-resonant frequency of the feed circuit.

4. The wireless IC device according to claim 1, wherein the feed circuit includes at least two inductance elements that have different inductance values and that are coupled to each other.

5. The wireless IC device according to claim 1, wherein the first radiation plate is disposed on a surface of the protective layer or inside the protective layer.

6. The wireless IC device according to claim 1, wherein the second radiation plate is disposed on a surface of a print substrate or inside the print substrate.

7. The wireless IC device according to claim 1, wherein a mounting external electrode is disposed on the other main surface of the feed circuit substrate.

8. The wireless IC device according to claim 1, wherein outermost dimensions of the first radiation plate are substantially the same as or less than outermost dimensions of the feed circuit substrate.

* * * * *